(12) United States Patent
Ooi et al.

(10) Patent No.: US 11,289,835 B2
(45) Date of Patent: Mar. 29, 2022

(54) PRINTED CIRCUIT BOARD (PCB) CONNECTOR INTERFACE MODULE WITH HEAT AND SCRATCH RESISTANT COVERLAY AND ACCESSORY SYSTEM

(71) Applicant: MOTOROLA SOLUTIONS, INC., Chicago, IL (US)

(72) Inventors: Chun Wen Ooi, Penang (MY); Jorge L. Garcia, Plantation, FL (US); Siew Im Low, Penang (MY); Kay Siang Sim, Penang (MY); Wooi Ping Teoh, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 230 days.

(21) Appl. No.: 16/803,135

(22) Filed: Feb. 27, 2020

(65) Prior Publication Data
US 2021/0273358 A1 Sep. 2, 2021

(51) Int. Cl.
| *H05K 1/11* | (2006.01) |
| *H01R 12/70* | (2011.01) |
| *H01R 12/71* | (2011.01) |
| *H05K 1/03* | (2006.01) |
| *H05K 1/09* | (2006.01) |

(52) U.S. Cl.
CPC ....... *H01R 12/7076* (2013.01); *H01R 12/714* (2013.01); *H05K 1/03* (2013.01); *H05K 1/11* (2013.01); *H05K 1/09* (2013.01); *H05K 1/112* (2013.01)

(58) Field of Classification Search
CPC ... H05K 1/03; H05K 1/11; H05K 1/09; H05K 1/112
See application file for complete search history.

(56) References Cited

U.S. PATENT DOCUMENTS

| 8,007,287 B1* | 8/2011 | Champion | H05K 1/0243 |
| | | | 439/66 |
| 9,680,273 B2 | 6/2017 | Light et al. | |
| 2007/0216019 A1* | 9/2007 | Hsu | H01L 23/49827 |
| | | | 257/700 |
| 2009/0297785 A1* | 12/2009 | Ueda | H01L 24/97 |
| | | | 428/172 |
| 2010/0062617 A1* | 3/2010 | Bang | H05K 13/00 |
| | | | 439/61 |
| 2016/0128217 A1* | 5/2016 | Yoo | H04M 1/0274 |
| | | | 361/731 |

(Continued)

*Primary Examiner* — Hoa C Nguyen
(74) *Attorney, Agent, or Firm* — Michael Best & Friedrich LLP

(57) ABSTRACT

A printed circuit board (PCB) connector interface module and an accessory system. The module including a first layer, a second layer, and a plurality of inner layers. The first layer includes a first set of contact pads configured to electrically connect to an accessory device, and a heat and scratch resistant coverlay that is adjacent to and has a first surface that is level with a first surface of the first set of contact pads. The second layer including a second set of contact pads configured to electrically connect to an internal printed circuit board (PCB) of an electronic apparatus. The plurality of inner layers including one or more printed circuit boards (PCB) and a plurality of contact vias, wherein the plurality of contact vias electrically connect the first set of contact pads to the second set of contact pads.

20 Claims, 5 Drawing Sheets

(56) References Cited

U.S. PATENT DOCUMENTS

2018/0070458 A1* 3/2018 Ahn ................... H05K 3/007
2018/0084637 A1* 3/2018 Ueda .................. H01Q 1/12
2020/0329562 A1* 10/2020 Hsieh ................. H05K 3/368

* cited by examiner

PRINTED CIRCUIT BOARD (PCB) CONNECTOR INTERFACE MODULE WITH HEAT AND SCRATCH RESISTANT COVERLAY AND ACCESSORY SYSTEM

BACKGROUND OF THE INVENTION

Electronic apparatuses may be connected to devices and components (for example, an accessory device) via electrical contacts and connectors. Generally, a printed circuit board (PCB) connector interface module electrically connects a battery contact and/or an input and output (I/O) contact disposed on a device housing to the applicable components. The PCB connector interface module may facilitate the transfer of electrical power from the battery disposed within the housing of the electronic apparatus to the applicable components of the accessory device. The PCB connector interface module may also facilitate the transfer of electronic information between an electronic processor disposed within the housing of the electronic apparatus to the applicable components the accessory device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
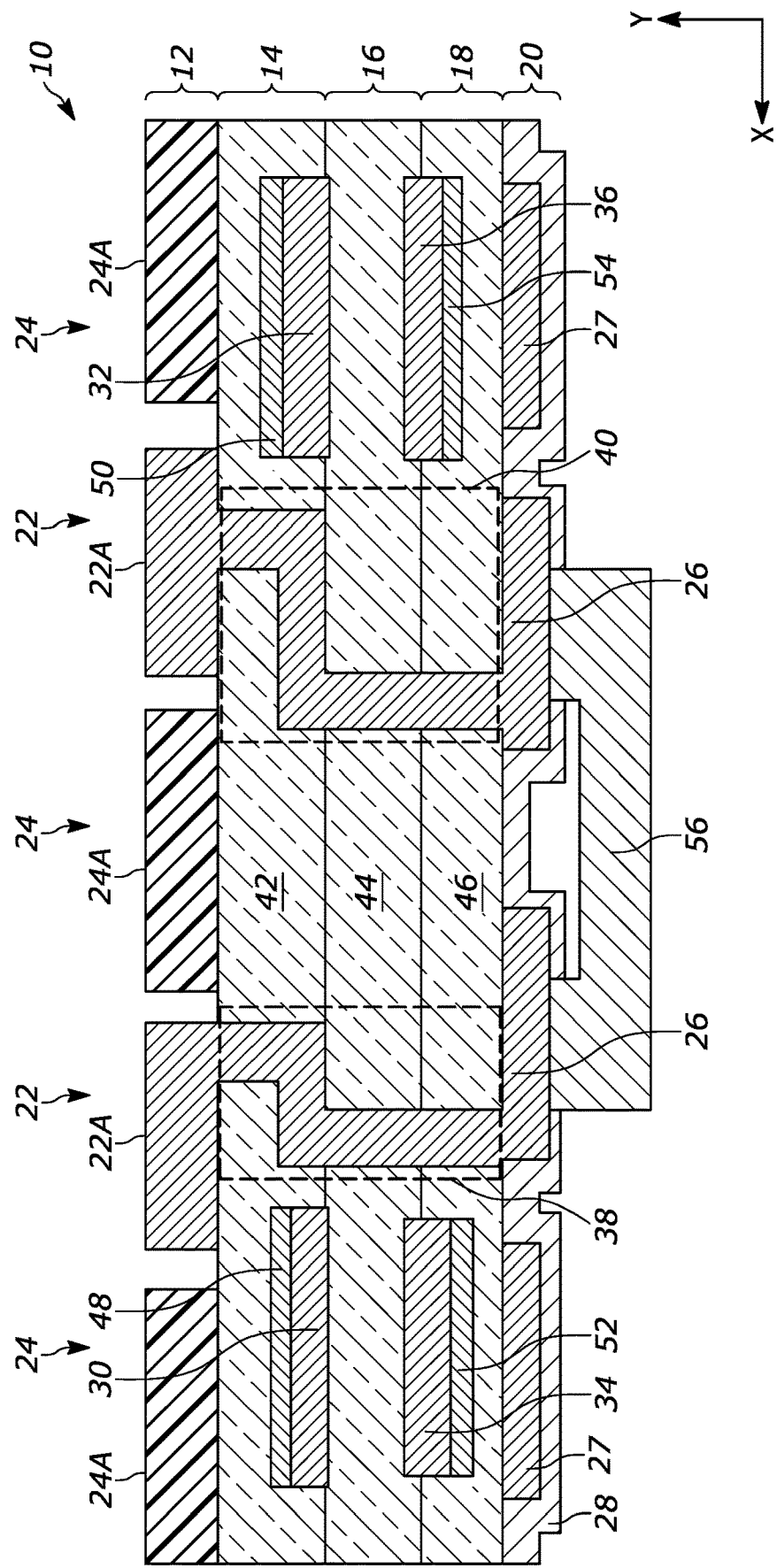
FIG. 1 is a diagram of a printed circuit board (PCB) connector interface module, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Using a polycarbonate escutcheon (generally, a protective plate) to build an accessory connector interface has several challenges. Some of these challenges include escutcheon lifting, escutcheon increased wear and tear, adhesive oozing, difficulty cleaning, copper pad denting, and water leakage. Using a printed circuit board (PCB) instead of a polycarbonate escutcheon may help solve some of these challenges. However, a PCB connector with a solder mask printed on top of the copper layer of the PCB connector generally has a weak scratch resistance. Indeed, scratches from a sharp object may expose the copper layer beside the contact pads, which increases the likelihood of a short circuit between the contact pads as well as reduces the cosmetic quality of the PCB connector.

One embodiment provides a printed circuit board (PCB) connector interface module comprising a first layer, a second layer, and a plurality of inner layers disposed between the first layer and the second layer. The first layer includes a first set of contact pads configured to electrically connect to an accessory device, and a heat and scratch resistant coverlay that is adjacent to the first set of contact pads and a first surface of the heat and scratch resistant coverlay is level with a first surface of the first set of contact pads. The second layer includes a second set of contact pads and a solder mask that is adjacent to the second set of contact pads The second set of contact pads is configured to electrically connect to an internal printed circuit board (PCB) of an electronic apparatus. The plurality of inner layers including one or more printed circuit boards (PCB) and a plurality of contact vias. The plurality of contact vias electrically connect the first set of contact pads to the second set of contact pads.

Another embodiment provides an accessory system comprising an electronic apparatus; an accessory device; and a printed circuit board (PCB) connector interface module. The PCB connecter interface module includes a first layer, a second layer, and a plurality of inner layers disposed between the first layer and the second layer. The first layer includes a first set of contact pads configured to electrically connect to the accessory device, and a heat and scratch resistant coverlay that is adjacent to the first set of contact pads and a first surface of the heat and scratch resistant coverlay is level with a first surface of the first set of contact pads. The second layer includes a second set of contact pads and a solder mask that is adjacent to the second set of contact pads The second set of contact pads is configured to electrically connect to an internal printed circuit board (PCB) of the electronic apparatus. The plurality of inner layers includes one or more printed circuit boards (PCB) and a plurality of contact vias The plurality of contact vias electrically connect the first set of contact pads to the second set of contact pads.

Embodiments of the PCB connector interface module addresses, among other things, the above-noted challenges with the polycarbonate escutcheon. Additionally, the heat and scratch resistant coverlay included in the PCB connector interface module addresses, among other things, the weak scratch resistance in the solder mask of the conventional PCB connectors.

FIG. 1 is a diagram of a printed circuit board (PCB) connector interface module 10, in accordance with some embodiments. FIG. 1 also shows a coordinate system with two axes: an X-axis and a Y-axis.

In the example of FIG. 1, the PCB connector interface module 10 includes a first layer 12, a plurality of inner layers 14-18, and a second layer 20. The first layer 12 includes a first set of contact pads 22 configured to electrically connect to an accessory device (e.g., the accessory device 404 illustrated in FIG. 5) and a heat and scratch resistant coverlay 24 that is adjacent to the first set of contact pads 22 in the X-direction. The heat and scratch resistant coverlay 24 may be a polyimide coverlay or other suitable heat and scratch resistant coverlay that has better heat and scratch resistance than the conventional solder mask. A first surface 24A of the heat and scratch resistant coverlay 24 is level with a first surface 22A of the first set of contact pads 22.

In some examples, the heat and scratch resistant coverlay 24 is disposed in the first layer 12 to have approximately sixty micrometers (μm) of height in the Y-direction. Additionally, in these examples, the first set of contact pads 22 is also disposed in the first layer 12 to have approximately sixty μm in height in the Y-direction. For example, the first set of contact pads 22 may include 17 μm of copper, 33 μm of copper plating, and 10 μm of gold plating disposed in this order along the Y-direction.

In other examples, the heat and scratch resistant coverlay 24 is disposed in the first layer 12 to have more than sixty micrometers (μm) of height in the Y-direction. In these examples, the heat and scratch resistant coverlay 24 may have approximately sixty micrometers (μm) of height in the Y-direction. In other words, in the above examples, the heat and scratch resistant coverlay 24 and the first set of contact pads 22 are approximately the same height in the Y-direction (e.g., 60 μm), and consequently, the heat and scratch resistant coverlay 24 and the first set of contact pads 22 each have surfaces that are level with each other (e.g., a surface of the heat and scratch resistant coverlay 24 and a gold plated surface of the first set of contact pads 22 are approximately flush with each other).

The second layer 20 includes a second set of contact pads 26, a ground 27 that is adjacent to the second set of contact pads 26 in the X-direction, and a solder mask 28 that is adjacent to the second set of contact pads 26 in the X-direction. The second set of contact pads 26 is configured to electrically connect to an internal printed circuit board (PCB) of an electronic apparatus (e.g., the electronic apparatus 402 illustrated in FIG. 5). The ground 27 is electrically connected to the second set of contact pads 26. The ground 27 may be used to gold plate the surfaces 22A of the first set of contact pads 22.

The plurality of inner layers 14-18 are disposed between the first layer 12 and the second layer 20. The plurality of inner layers 14-18 include printed circuit boards (PCBs) 30-36 and a plurality of contact vias 38 and 40. The plurality of inner layers 14-18 also includes corresponding prepreg layers 42-46 and oxide layers 48-54, each of the oxide layers 48-54 is disposed between one of the PCBs 30-36 and one of the prepreg layers 42-46. In the example of FIG. 1, inner layers 14 and 18 are considered "signal" layers because inner layers 14 and 18 almost entirely include the PCBs 30-36. Additionally, in the example of FIG. 1, the inner layer 16 is considered a "core" layer because inner layer 16 is a continuous prepreg layer that provides structural support as the core layer and mostly does not include the PCBs 30-36.

The prepreg layers 42-46 are formed from a translucent material and the oxide layers 48-54 are formed from a brown or black oxide treatment. For example, the translucent material may be a fiberglass fabric that is impregnated with an epoxy resin or other suitable translucent material. Therefore, the brown or black oxide treatment of the oxide layers 48-54 may be visible to the naked eye via gaps between the first set of contact pads 22 and the heat and scratch resistant coverlay 24. For example, a gap of approximately one hundred and fifty μm in width along the X-direction may exist between the first set of contact pads 22 adjacent to the heat and scratch resistant coverlay 24.

The plurality of contact vias 38 and 40 electrically connect the first set of contact pads 22 to the second set of contact pads 26. In some examples, the second set of contact pads 26 are also electrically connected to a connector 56 (e.g., a flexible printed circuit (FPC) connector).

Figure 2:
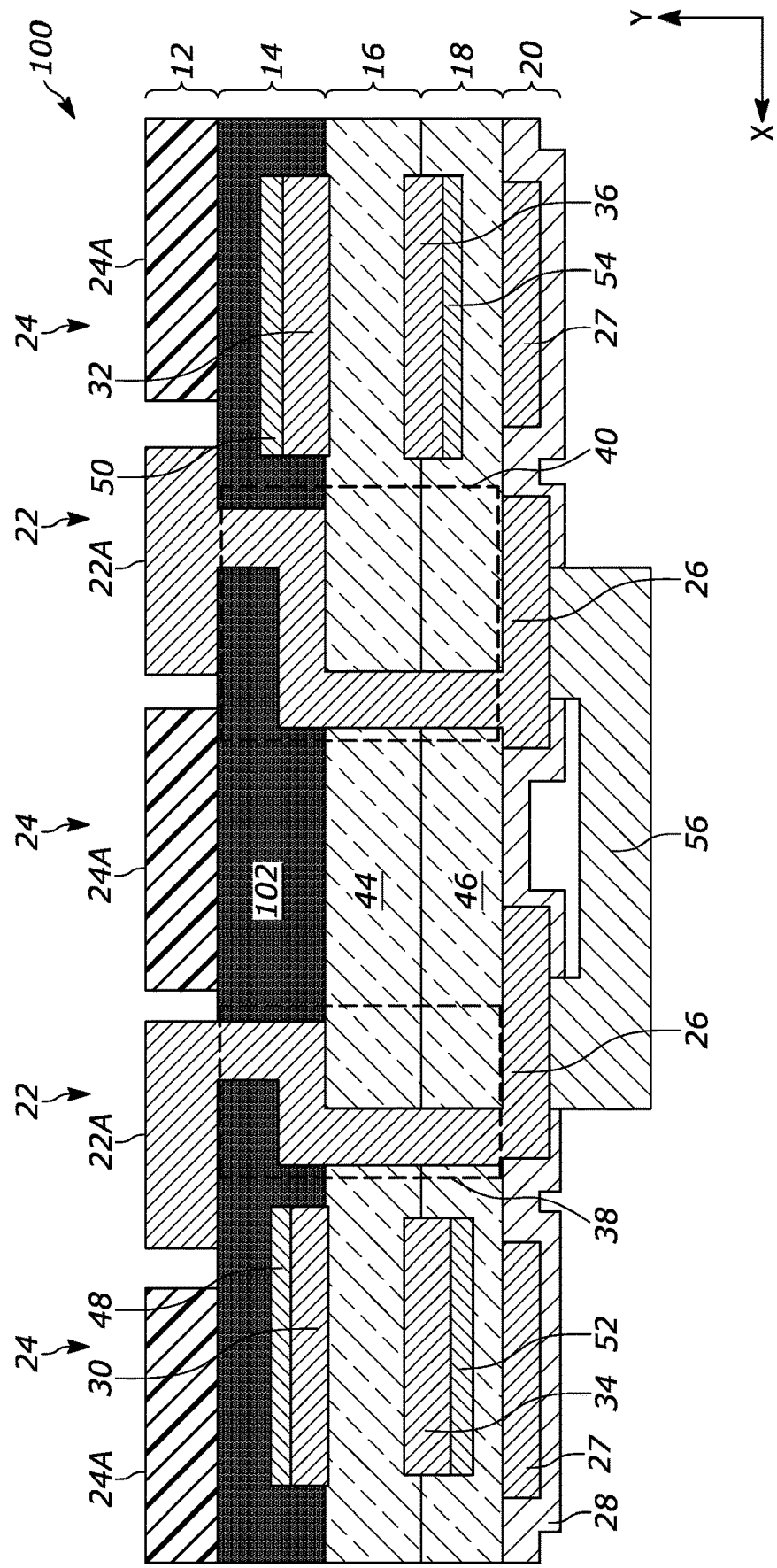
FIG. 2 is a diagram of another printed circuit board (PCB) connector interface module, in accordance with some embodiments.

FIG. 2 is a diagram of another printed circuit board (PCB) connector interface module 100, in accordance with some embodiments. FIG. 2 is substantially similar to FIG. 1. Consequently, redundant descriptions of similar components is omitted.

In the example of FIG. 2, the prepreg layer 102 is either formed from a non-translucent material or are formed from a translucent material that is colored to be non-translucent. Therefore, the brown or black oxide treatment of the oxide layers 48-54 in the PCB connector interface module 100 will not be visible to the naked eye via gaps between the first set of contact pads 22 and the heat and scratch resistant coverlay 24.

Figure 3:
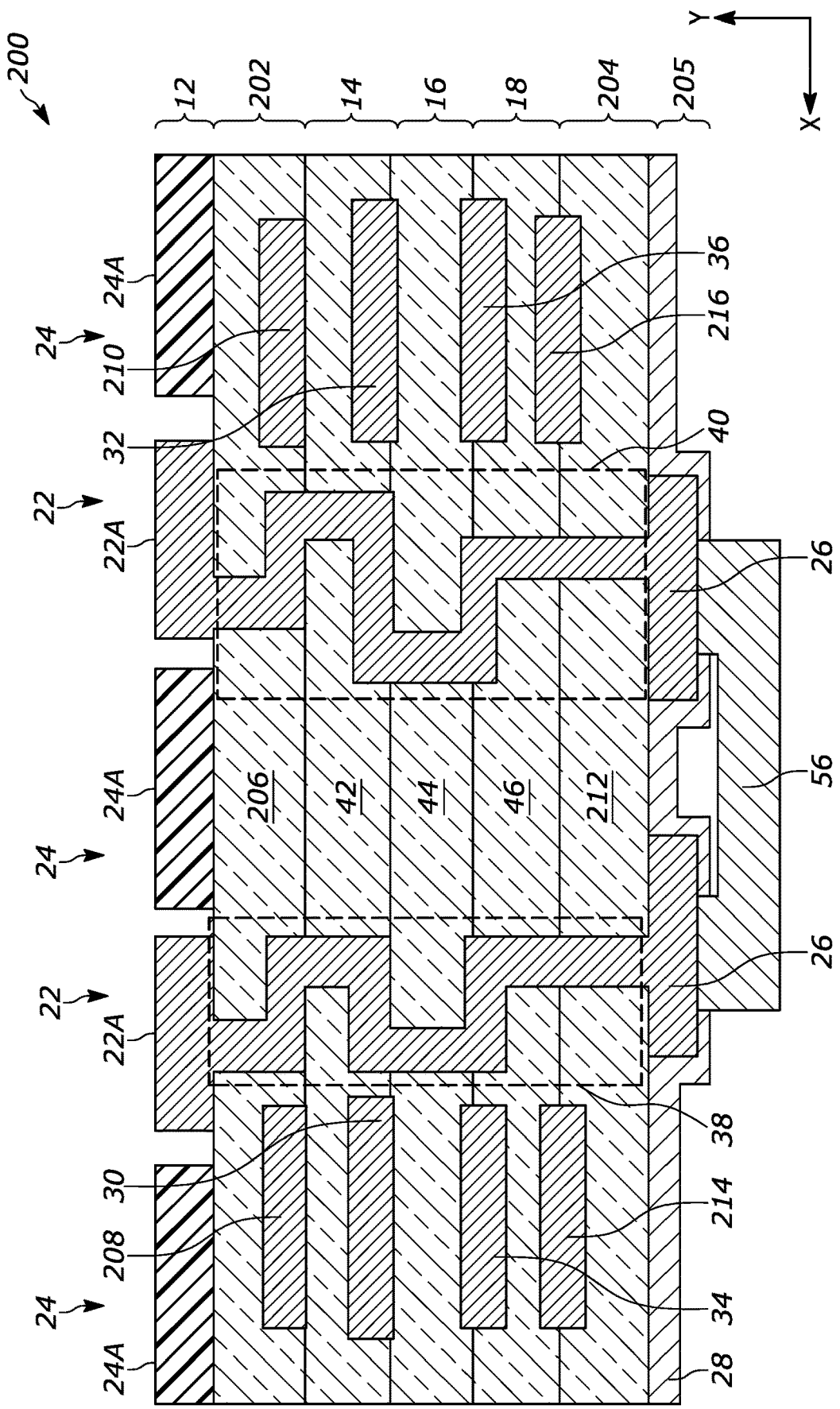
FIG. 3 is a diagram of yet another printed circuit board (PCB) connector interface module, in accordance with some embodiments.

FIG. 3 is a diagram of yet another printed circuit board (PCB) connector interface module 200, in accordance with some embodiments. FIG. 3 is similar to FIG. 1. Consequently, redundant descriptions of similar components is omitted.

In the example of FIG. 3, the PCB connector interface module 200 includes inner layers 202 and 204 in addition to inner layers 14-18, and a second layer 205. In the example of FIG. 3, inner layer 204 is also considered a "signal" layer because inner layer 204 at least partially includes PCBs 214 and 216, which are similar to the PCBs 30-36. The inner layer 204 also include prepreg layer 212, which is similar to the prepreg layer 42.

Additionally, in the example of FIG. 3, the inner layer 202 is considered a "protection" layer because the inner layer 202 is a layer that provides environmental protection to the other inner layers 14-18 and 204. As illustrated in FIG. 3, the inner layer 202 includes PCBs 208 and 210. In some embodiments, PCBs 214 and 216 may be different from the PCBs 30-36 because the PCBs 214 and 216 may simply be used for radio frequency (RF) protection for the other PCBs 30-36 in the "signal" layers, where RF signal interference comes from the device side of the PCB connector interface module 200.

Lastly, the second layer 205 is similar to the second layer 20 as described above in FIGS. 1 and 2. However, as illustrated in FIG. 3, the second layer 205 does not include the ground 27 adjacent to the second set of contacts 26.

Figure 4:
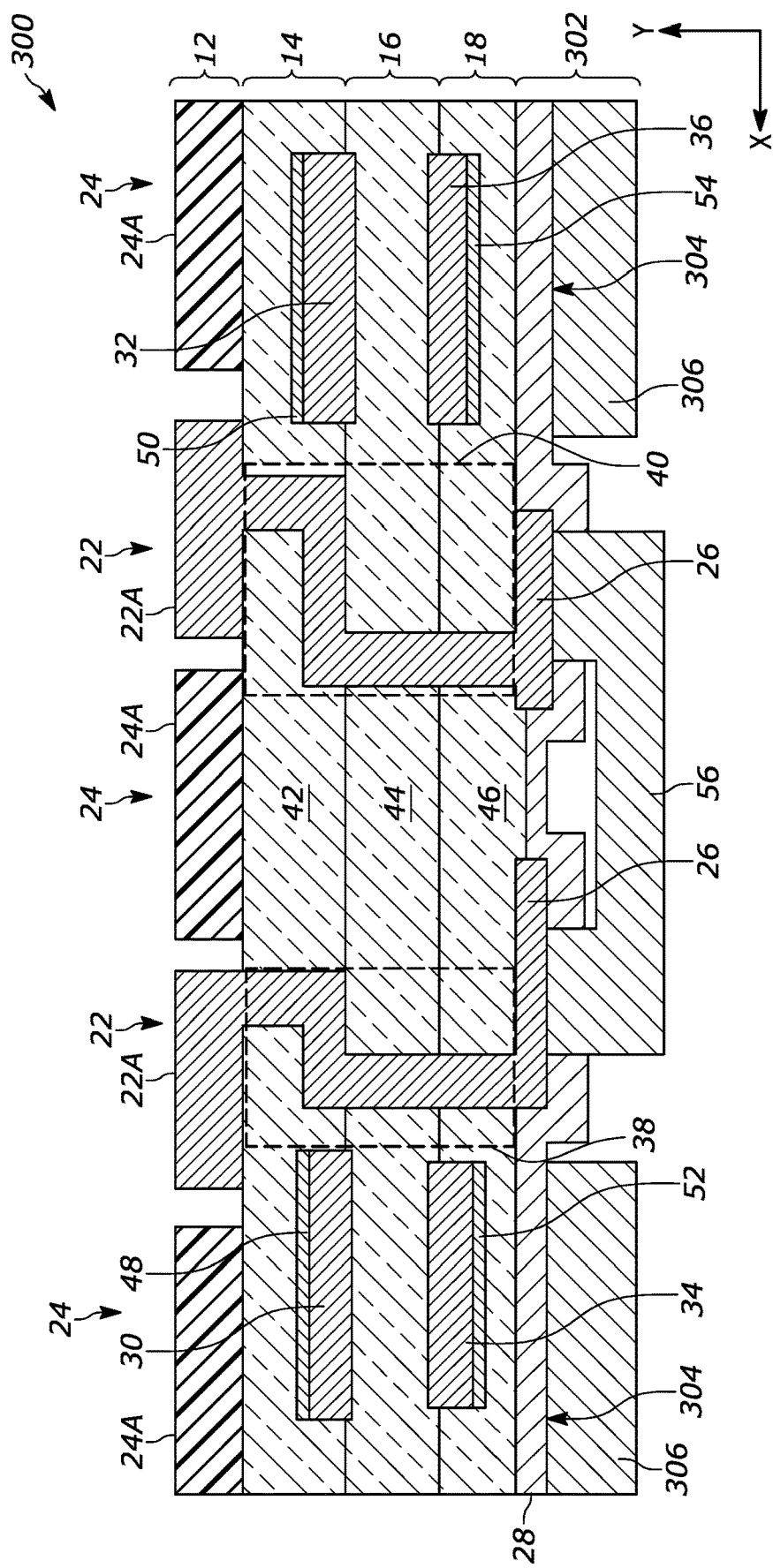
FIG. 4 is a diagram of another printed circuit board (PCB) connector interface module, in accordance with some embodiments.

FIG. 4 is a diagram of another printed circuit board (PCB) connector interface module 300, in accordance with some embodiments. FIG. 4 is substantially similar to FIG. 1. Consequently, redundant descriptions of similar components is omitted.

In the example of FIG. 4, the PCB connector interface module 300 includes a second layer 302 instead of a second layer 20. The second layer 302 includes the second set of contact pads 26 for connector 56, a gang ground cut area 304, the solder mask 28, and an adhesive 306. The gang round cut area 304 is adjacent to the connector 56 in the X-direction and is formed by removal of copper ground material and also tie bar traces that were adjacent to the second set of contact pads 26.

The adhesive 306 is disposed on only the gang ground cut area 304. The adhesive 306 is configured to adhere to an electronic apparatus (e.g., the electronic apparatus 402 illustrated in FIG. 5).

Figure 5:
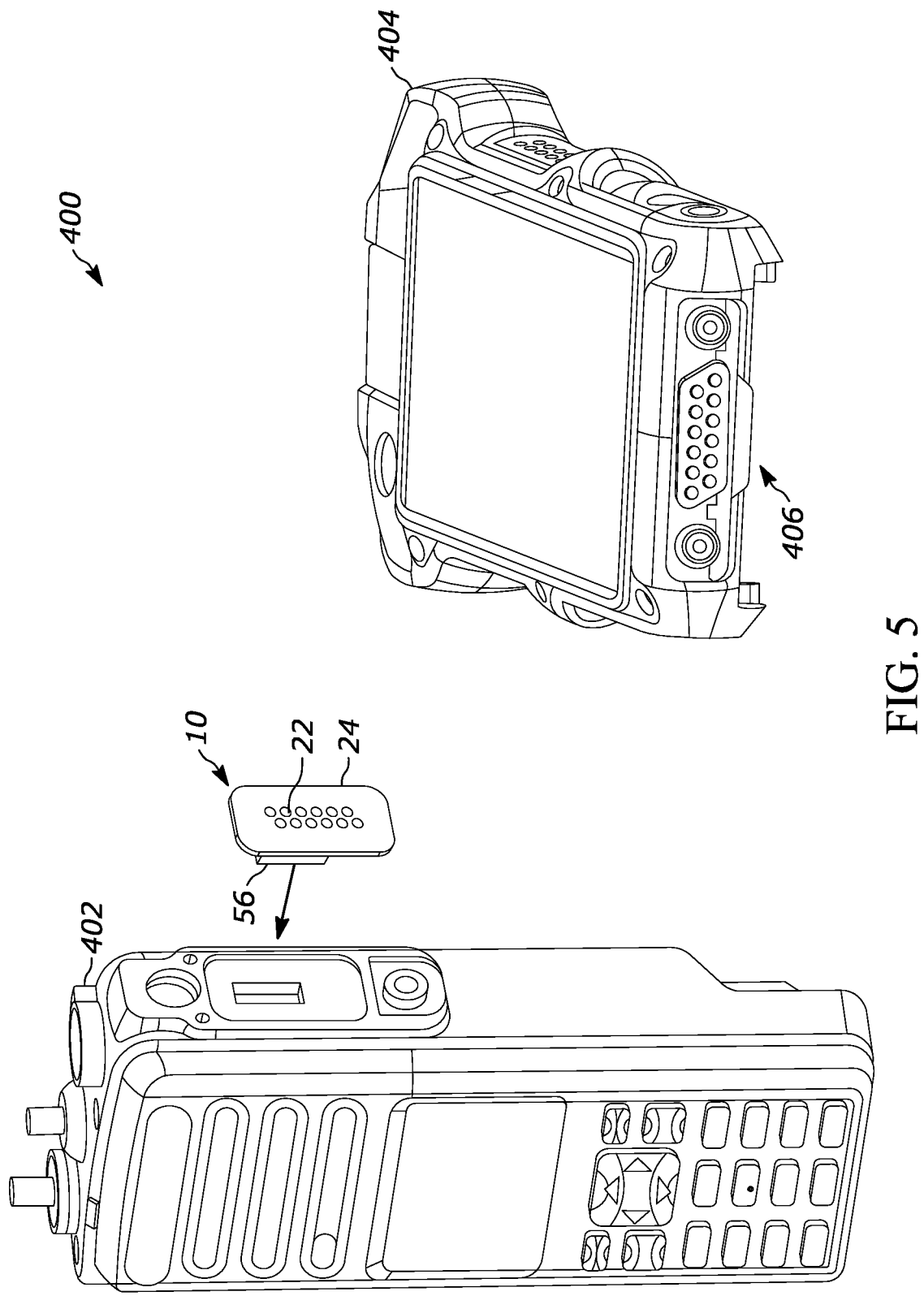
FIG. 5 is a diagram of an accessory system including the printed circuit board (PCB) connector interface module of FIG. 1, in accordance with some embodiments.

FIG. 5 is a diagram of an accessory system 400 including the PCB connector interface module 10 of FIG. 1, in accordance with some embodiments. In the example of FIG. 5, the accessory system includes, the PCB connector interface module 10, an electronic apparatus 402, and an accessory device 404. While FIG. 5 is illustrated with the PCB connector interface module 10 of FIG. 1, FIG. 5 may alternatively include any of the PCB connector interface modules 100-300 as described with respect to FIGS. 2-4.

As illustrated in FIG. 5, the connector 56 on one side of the PCB connector interface module 10 is configured to electrically connect to an internal printed circuit board (PCB) disposed within the electronic apparatus 402. The first set of contact pads 22 on the other side of the PCB connector interface module 10 is configured to electrically connect to a set of contacts pads 406 on the accessory device 404 via a wired connection.

In some embodiments, the electronic apparatus is 402 is one of a handheld radio, land-marine radio, or other suitable mobile device with an internal PCB that communicates with an accessory device via a wired connection. In some embodiments, the accessory device 404 is one of a body-worn camera, remote speaker microphone (RSM), earpiece, augmented-reality glasses, or other suitable accessory device that receives power and/or electronic information from an electronic apparatus via a wired connection.

The following are enumerated examples of the printed circuit board (PCB) connector interface modules and accessory systems of the present disclosure:

Example 1: a printed circuit board (PCB) connector interface module comprising a first layer including a first set of contact pads configured to electrically connect to an accessory device, and a heat and scratch resistant coverlay that is adjacent to the first set of contact pads and a first surface of the heat and scratch resistant coverlay is level with a first surface of the first set of contact pads; a second layer including a second set of contact pads and a solder mask that is adjacent to the second set of contact pads, the second set of contact pads is configured to electrically connect to an internal printed circuit board (PCB) of an electronic apparatus; a plurality of inner layers disposed between the first layer and the second layer, the plurality of inner layers including one or more printed circuit boards (PCB) and a plurality of contact vias, wherein the plurality of contact vias electrically connect the first set of contact pads to the second set of contact pads.

Example 2: the PCB connector interface module of Example 1, wherein the plurality of inner layers includes a first signal layer including a first portion of the plurality of contact vias, a first printed circuit board (PCB), and a first prepeg layer adjacent to the first portion of the plurality of contact vias and positioned between the first layer and the first PCB, a core layer including a second portion of the plurality of contact vias and a second prepeg layer adjacent to the second portion of the plurality of contact vias, and a second signal layer including a third portion of the plurality of contact vias, a third prepeg layer adjacent to the third portion of the plurality of contact vias, and a second printed circuit board (PCB).

Example 3: the PCB connector interface module of Example 2, wherein the first signal layer includes a first oxide layer disposed on a first side of the first PCB, wherein the first oxide layer is between the first side of the first PCB and the first prepeg layer, wherein the second signal layer includes a second oxide layer disposed on a second side of the second PCB, wherein the second oxide layer is between the second side of the second PCB and the third prepeg layer.

Example 4: the PCB connector interface module of Example 3, wherein the heat and scratch resistant coverlay has a first color, wherein the first oxide layer has a second color that is different than the first color, and wherein the first prepeg layer is translucent.

Example 5: the PCB connector interface module of Example 3, wherein the heat and scratch resistant coverlay has a first color, wherein the first oxide layer has a second color that is different than the first color, and wherein the first prepeg layer has a third color that is similar to the first color.

Example 6: the PCB connector interface module of any of Examples 1-5, wherein the plurality of inner layers includes a protection layer including a first portion of the plurality of contact vias, a copper layer, and a first prepeg layer adjacent to the first portion of the plurality of contact vias and positioned between the first layer and the copper layer, a first signal layer including a second portion of the plurality of contact vias, a second prepeg layer adjacent to the second portion of the plurality of contact vias, and a first printed circuit board, a core layer including a third portion of the plurality of contact vias and a third prepeg layer adjacent to the third portion of the plurality of contact vias, a second signal layer including a fourth portion of the plurality of contact vias, a fourth prepeg layer adjacent to the fourth portion of the plurality of contact vias, and a second printed circuit board, and a third signal layer including a fifth portion of the plurality of contact vias, a fifth prepeg layer adjacent to the fifth portion of the plurality of contact vias, and a third printed circuit board.

Example 7: the PCB connector interface module of any of Examples 1-6, further comprising a connector that is electrically connected to the second set of contact pads, wherein the second layer further includes a gang ground cut area that is adjacent to the connector, and wherein the second set of contact pads is configured to electrically connect to the internal PCB via the connector.

Example 8: the PCB connector interface module of Example 7, wherein the second layer further includes an adhesive disposed on only the gang ground cut area, and wherein the adhesive is configured to adhere to the electronic apparatus.

Example 9: the PCB connector interface module of Example 7, wherein the connector is a flexible printed circuit (FPC) connector.

Example 10: the PCB connector interface module of any of Examples 1-9, wherein the first layer includes a gap between the first set of contact pads and the heat and scratch resistant coverlay.

Example 11: the PCB connector interface module of any of Examples 1-10, wherein the first set of contact pads are gold plated copper contact pads, wherein the second set of contact pads are copper contact pads, and wherein the plurality of contact vias are a plurality of copper contact vias.

Example 12: the PCB connector interface module of Example 11, wherein the first set of contact pads include 50 micrometers of copper plated with 10 micrometers of gold, and wherein the heat and scratch resistant coverlay includes 60 micrometers of polyimide.

Example 13: the PCB connector interface module of Example 12, wherein the heat and scratch resistant coverlay is disposed on a gang ground cut area adjacent to the first set of contact pads.

Example 14: the PCB connector interface module of any of Examples 1-13, wherein the first set of contact pads are gold plated copper contact pads, wherein the second set of contact pads are two or more copper pads connected with tie bar traces, and wherein the plurality of contact vias are a plurality of copper contact vias.

Example 15: the PCB connector interface module of any of Examples 1-14, wherein the first surface of the heat and scratch resistant coverlay is level with the first surface of the first set of contact pads to within one micrometer.

Example 16: an accessory system comprising an electronic apparatus; an accessory device; and a printed circuit board (PCB) connector interface module including a first layer including a first set of contact pads configured to electrically connect to the accessory device, and a heat and scratch resistant coverlay that is adjacent to the first set of contact pads and a first surface of the heat and scratch resistant coverlay is level with a first surface of the first set of contact pads, a second layer including a second set of contact pads and a solder mask that is adjacent to the second set of contact pads, the second set of contact pads is configured to electrically connect to an internal printed circuit board (PCB) of the electronic apparatus, and a plurality of inner layers disposed between the first layer and the second layer, the plurality of inner layers including one or more printed circuit boards (PCB) and a plurality of contact vias, wherein the plurality of contact vias electrically connect the first set of contact pads to the second set of contact pads.

Example 17: the accessory system of Example 16, wherein the plurality of inner layers includes a first signal layer including a first portion of the plurality of contact vias, a first printed circuit board (PCB), and a first prepeg layer adjacent to the first portion of the plurality of contact vias and positioned between the first layer and the first PCB, a core layer including a second portion of the plurality of contact vias and a second prepeg layer adjacent to the second portion of the plurality of contact vias, and a second signal layer including a third portion of the plurality of contact vias, a third prepeg layer adjacent to the third portion of the plurality of contact vias, and a second printed circuit board (PCB).

Example 18: the accessory system of Example 17, wherein the first signal layer includes a first oxide layer disposed on a first side of the first PCB, wherein the first oxide layer is between the first side of the first PCB and the first prepeg layer, wherein the second signal layer includes a second oxide layer disposed on a second side of the second PCB, wherein the second oxide layer is between the second side of the second PCB and the third prepeg layer.

Example 19: the accessory system of Example 18, wherein the heat and scratch resistant coverlay has a first color, wherein the first oxide layer has a second color that is different than the first color, and wherein the first prepeg layer has a third color that is similar to the first color.

Example 20: the accessory system of any of Examples 16-19, wherein the plurality of inner layers includes a protection layer including a first portion of the plurality of contact vias, a copper layer, and a first prepeg layer adjacent to the first portion of the plurality of contact vias and positioned between the first layer and the copper layer, a first signal layer including a second portion of the plurality of contact vias, a second prepeg layer adjacent to the second portion of the plurality of contact vias, and a first printed circuit board, a core layer including a third portion of the plurality of contact vias and a third prepeg layer adjacent to the third portion of the plurality of contact vias, a second signal layer including a fourth portion of the plurality of contact vias, a fourth prepeg layer adjacent to the fourth portion of the plurality of contact vias, and a second printed circuit board, and a third signal layer including a fifth portion of the plurality of contact vias, a fifth prepeg layer adjacent to the fifth portion of the plurality of contact vias, and a third printed circuit board.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A printed circuit board (PCB) connector interface module comprising:
    a first layer including
        a first set of contact pads configured to electrically connect to an accessory device, and
        a heat and scratch resistant coverlay that is adjacent to the first set of contact pads and a first surface of the heat and scratch resistant coverlay is level with a first surface of the first set of contact pads;
    a second layer including a second set of contact pads and a solder mask that is adjacent to the second set of contact pads, the second set of contact pads is configured to electrically connect to an internal printed circuit board (PCB) of an electronic apparatus;
    a plurality of inner layers disposed between the first layer and the second layer, the plurality of inner layers including one or more printed circuit boards (PCB) and a plurality of contact vias, wherein the plurality of contact vias electrically connect the first set of contact pads to the second set of contact pads.

2. The PCB connector interface module of claim 1, wherein the plurality of inner layers includes
    a first signal layer including a first portion of the plurality of contact vias, a first printed circuit board (PCB), and a first prepeg layer adjacent to the first portion of the plurality of contact vias and positioned between the first layer and the first PCB,
    a core layer including a second portion of the plurality of contact vias and a second prepeg layer adjacent to the second portion of the plurality of contact vias, and
    a second signal layer including a third portion of the plurality of contact vias, a third prepeg layer adjacent to the third portion of the plurality of contact vias, and a second printed circuit board (PCB).

3. The PCB connector interface module of claim 2, wherein the first signal layer includes a first oxide layer disposed on a first side of the first PCB, wherein the first oxide layer is between the first side of the first PCB and the first prepeg layer, wherein the second signal layer includes a second oxide layer disposed on a second side of the second PCB, wherein the second oxide layer is between the second side of the second PCB and the third prepeg layer.

4. The PCB connector interface module of claim 3, wherein the heat and scratch resistant coverlay has a first color, wherein the first oxide layer has a second color that is different than the first color, and wherein the first prepeg layer is translucent.

5. The PCB connector interface module of claim 3, wherein the heat and scratch resistant coverlay has a first color, wherein the first oxide layer has a second color that is different than the first color, and wherein the first prepeg layer has a third color that is similar to the first color.

6. The PCB connector interface module of claim 1, wherein the plurality of inner layers includes
    a protection layer including a first portion of the plurality of contact vias, a copper layer, and a first prepeg layer adjacent to the first portion of the plurality of contact vias and positioned between the first layer and the copper layer,
    a first signal layer including a second portion of the plurality of contact vias, a second prepeg layer adjacent to the second portion of the plurality of contact vias, and a first printed circuit board,
    a core layer including a third portion of the plurality of contact vias and a third prepeg layer adjacent to the third portion of the plurality of contact vias,
    a second signal layer including a fourth portion of the plurality of contact vias, a fourth prepeg layer adjacent to the fourth portion of the plurality of contact vias, and a second printed circuit board, and
    a third signal layer including a fifth portion of the plurality of contact vias, a fifth prepeg layer adjacent to the fifth portion of the plurality of contact vias, and a third printed circuit board.

7. The PCB connector interface module of claim 1, further comprising:
    a connector that is electrically connected to the second set of contact pads,
    wherein the second layer further includes a gang ground cut area that is adjacent to the connector, and
    wherein the second set of contact pads is configured to electrically connect to the internal PCB via the connector.

8. The PCB connector interface module of claim 7, wherein the second layer further includes an adhesive disposed on only the gang ground cut area, and wherein the adhesive is configured to adhere to the electronic apparatus.

9. The PCB connector interface module of claim 7, wherein the connector is a flexible printed circuit (FPC) connector.

10. The PCB connector interface module of claim 1, wherein the first layer includes a gap between the first set of contact pads and the heat and scratch resistant coverlay.

11. The PCB connector interface module of claim 1, wherein the first set of contact pads are gold plated copper contact pads, wherein the second set of contact pads are copper contact pads, and wherein the plurality of contact vias are a plurality of copper contact vias.

12. The PCB connector interface module of claim 11, wherein the first set of contact pads include 50 micrometers of copper plated with 10 micrometers of gold, and wherein the heat and scratch resistant coverlay includes 60 micrometers of polyimide.

13. The PCB connector interface module of claim 12, wherein the heat and scratch resistant coverlay is disposed on a gang ground cut area adjacent to the first set of contact pads.

14. The PCB connector interface module of claim 1, wherein the first set of contact pads are gold plated copper contact pads, wherein the second set of contact pads are two or more copper pads connected with tie bar traces, and wherein the plurality of contact vias are a plurality of copper contact vias.

15. The PCB connector interface module of claim 1, wherein the first surface of the heat and scratch resistant coverlay is level with the first surface of the first set of contact pads to within one micrometer.

16. An accessory system comprising:
an electronic apparatus;
an accessory device; and
a printed circuit board (PCB) connector interface module including
a first layer including
a first set of contact pads configured to electrically connect to the accessory device, and
a heat and scratch resistant coverlay that is adjacent to the first set of contact pads and a first surface of the heat and scratch resistant coverlay is level with a first surface of the first set of contact pads,
a second layer including a second set of contact pads and a solder mask that is adjacent to the second set of contact pads, the second set of contact pads is configured to electrically connect to an internal printed circuit board (PCB) of the electronic apparatus, and
a plurality of inner layers disposed between the first layer and the second layer, the plurality of inner layers including one or more printed circuit boards (PCB) and a plurality of contact vias, wherein the plurality of contact vias electrically connect the first set of contact pads to the second set of contact pads.

17. The accessory system of claim 16, wherein the plurality of inner layers includes
a first signal layer including a first portion of the plurality of contact vias, a first printed circuit board (PCB), and a first prepeg layer adjacent to the first portion of the plurality of contact vias and positioned between the first layer and the first PCB,
a core layer including a second portion of the plurality of contact vias and a second prepeg layer adjacent to the second portion of the plurality of contact vias, and
a second signal layer including a third portion of the plurality of contact vias, a third prepeg layer adjacent to the third portion of the plurality of contact vias, and a second printed circuit board (PCB).

18. The accessory system of claim 17, wherein the first signal layer includes a first oxide layer disposed on a first side of the first PCB, wherein the first oxide layer is between the first side of the first PCB and the first prepeg layer, wherein the second signal layer includes a second oxide layer disposed on a second side of the second PCB, wherein the second oxide layer is between the second side of the second PCB and the third prepeg layer.

19. The accessory system of claim 18, wherein the heat and scratch resistant coverlay has a first color, wherein the first oxide layer has a second color that is different than the first color, and wherein the first prepeg layer has a third color that is similar to the first color.

20. The accessory system of claim 16, wherein the plurality of inner layers includes
a protection layer including a first portion of the plurality of contact vias, a copper layer, and a first prepeg layer adjacent to the first portion of the plurality of contact vias and positioned between the first layer and the copper layer,
a first signal layer including a second portion of the plurality of contact vias, a second prepeg layer adjacent to the second portion of the plurality of contact vias, and a first printed circuit board,
a core layer including a third portion of the plurality of contact vias and a third prepeg layer adjacent to the third portion of the plurality of contact vias,
a second signal layer including a fourth portion of the plurality of contact vias, a fourth prepeg layer adjacent to the fourth portion of the plurality of contact vias, and a second printed circuit board, and
a third signal layer including a fifth portion of the plurality of contact vias, a fifth prepeg layer adjacent to the fifth portion of the plurality of contact vias, and a third printed circuit board.

* * * * *